United States Patent
Kawasumi et al.

(10) Patent No.: US 7,071,737 B2
(45) Date of Patent: Jul. 4, 2006

(54) SYSTEMS AND METHODS FOR CONTROLLING TIMING IN A CIRCUIT

(75) Inventors: Atsushi Kawasumi, Austin, TX (US); Takaaki Nakazato, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 10/890,084

(22) Filed: Jul. 13, 2004

(65) Prior Publication Data

US 2006/0012403 A1    Jan. 19, 2006

(51) Int. Cl.
*G11C 7/00* (2006.01)
*G01R 19/00* (2006.01)

(52) U.S. Cl. .......................... 327/51; 327/57; 365/207; 365/205

(58) Field of Classification Search ............ 327/50–51; 365/205–208
See application file for complete search history.

(56) References Cited

U.S. PATENT DOCUMENTS

| | | | | |
|---|---|---|---|---|
| 5,053,996 | A | | 10/1991 | Siemmer |
| 5,126,974 | A | * | 6/1992 | Sasaki et al. ................ 365/207 |
| 5,828,239 | A | * | 10/1998 | Lotfi ............................. 327/51 |
| 5,850,359 | A | * | 12/1998 | Liu ............................... 365/156 |
| 6,016,065 | A | * | 1/2000 | Kong ........................... 326/121 |
| 6,204,697 | B1 | * | 3/2001 | Zerbe ............................ 326/98 |
| 6,473,334 | B1 | | 10/2002 | Bailey et al. |
| 6,873,559 | B1 | * | 3/2005 | Ueda ............................ 365/205 |
| 6,888,202 | B1 | | 5/2005 | Kang et al. |
| 2002/0020886 | A1 | | 2/2002 | Rockett |
| 2003/0156461 | A1 | * | 8/2003 | Demone ................ 365/189.05 |

FOREIGN PATENT DOCUMENTS

| JP | 2837682 | 7/1990 |
|---|---|---|
| JP | 6-291282 | 10/1994 |

OTHER PUBLICATIONS

Bernstein et al;SOI circuit Design Concepts; Chapter 8.7; Kluwer Academic Publishers.

* cited by examiner

*Primary Examiner*—Dinh T. Le
(74) *Attorney, Agent, or Firm*—Law Offices of Mark L. Berrier

(57) ABSTRACT

Systems and methods for reducing or eliminating the effect of timing variations in signals generated by devices that are subject to the history effect, wherein devices are enabled using a combination of timing signals, some of which are subject to timing variations arising from the history effect, and some of which are not. In one embodiment, a sense amplifier includes a pair of serially configured transistors that couple the sense amplifier to ground. One of the transistors is switched on/off by a clock signal that is not subject to history-effect timing variations, and the other is switched on/off by a signal that is subject to such variations. The second signal has pulses that are selectively delayed so that they will (or will not) overlap with the pulses of the clock signal in a controlled manner.

23 Claims, 7 Drawing Sheets

SYSTEMS AND METHODS FOR CONTROLLING TIMING IN A CIRCUIT

BACKGROUND

1. Field of the Invention

The invention relates generally to the field of electronic circuits and more particularly to systems and methods for reducing or eliminating the variability of timing associated with history effects in silicon-on-insulator (SOI) devices.

2. Related Art

Sense amplifiers are devices that are commonly used to amplify small voltage differences. For instance, a voltage difference on the order of 10–100 millivolts may be amplified to a voltage of 1–3 volts. In one type of sense amplifier, voltages are detected on a pair of input lines, and corresponding amplified voltages are generated on a pair of output lines. In another type of sense amplifier, voltages are detected on a pair of data lines, and these same data lines are then pulled to levels that effectively amplify the original voltage difference. That is, the data line that initially has the higher voltage is pulled to a predetermined high voltage (e.g., Vdd), and the data line that initially has the lower voltage is pulled to a predetermined low voltage (e.g., ground).

Referring to FIG. 1, a diagram illustrating the design of an exemplary latch-type sense amplifier in accordance with the prior art is shown. Sense amplifier 100 consists of seven interconnected transistors. Data lines 111 and 112 are coupled to nodes 131 and 132 through PMOS transistors 121 and 122, respectively. The gates of transistors 121 and 122 are both coupled to signal line 132 to receive a transfer signal, /xfer. Intermediate node 131 is coupled to a power supply voltage, Vdd, through transistor 141, and is coupled to ground through transistors 151 and 160. Similarly, intermediate node 132 is coupled to the power supply voltage through transistor 142, and is coupled to ground through transistors 152 and 160. When transistors 141 and 142 are switched on, they pull the voltages at nodes 131 and 132, respectively, toward Vdd, and when transistors 151 and 152 are switched on, they pull the voltages at nodes 131 and 132, respectively, toward ground. The gates of transistors 141 and 151 are tied together, and are cross coupled to node 132. The gates of transistors 142 and 152 are likewise tied together, and are cross coupled to node 131.

The operation of sense amplifier 100 will be described with reference to FIG. 2. FIG. 2 is a diagram illustrating the voltage levels at nodes 131 and 132, as well as an enable signal, SAEN. Initially, both node 131 and node 132 are pre-charged to Vdd. At some time, $t_1$, the voltage at either node 131 or node 132 begins to drop below Vdd. Sense amplifier 100 is enabled, or "fired," when a voltage difference has developed between nodes 131 and 132. In this embodiment, sense amplifier is enabled when the voltage difference is about 100 millivolts. FIG. 2 shows the enable signal, SAEN, going high at time $t_2$, thereby enabling the sense amplifier.

It should be noted that "enabled," as used here, refers to the coupling of the upper portion of the circuit to ground through transistor 160 (i.e., by switching the transistor on.) Likewise, "disabled," or "not enabled" are intended to refer to the decoupling of the upper portion of the circuit from ground by switching off transistor 160. The use of this terminology is not intended to imply that, when the sense amplifier is "disabled," the entirety of the circuit is disabled, and it is clear that there are various processes that occur within sense amplifier 100 (e.g., precharging the intermediate nodes, developing voltage differences between the intermediate nodes, etc.) while the sense amplifier is "disenabled" (i.e., when transistor 160 is switched off.) These terms will be used in the same manner below with respect to the descriptions of the various embodiments of the invention.

As pointed out above, nodes 131 and 132 are cross coupled to the gates of the transistors on the opposite sides of sense amplifier 100. Because nodes 131 and 132 are both initially pre-charged to Vdd, transistors 141 and 142 are initially switched off, while transistors 151 and 152 are initially switched on. Even though transistors 151 and 152 are switched on, however, they do not pull the voltages at nodes 131 and 132 to ground because enable signal SAEN is low, so transistor 160 is switched off. As the voltage at one of nodes 131 or 132 begins to drop below Vdd, the transistors on the opposite side of sense amplifier 100 are switched on and off less strongly. For example, as shown in FIG. 2, the voltage at node 132 begins to drop below Vdd, so transistor 141 is switched off less strongly than at time $t_0$, and transistor 151 is switched on less strongly than at time $t_0$. As a result, the voltage at node 131 is more strongly pulled toward Vdd than the voltage at node 132.

Sense amplifier 100 is enabled at time $t_2$ when SAEN goes high. More specifically, transistor 160 is switched on, so that nodes 131 and 132 are pulled toward ground through transistors 151 and 152, respectively. Because the voltage at node 131 is higher than the voltage at node 132, transistor 152 is switched on more strongly than transistor 151. As a result, the voltage at node 132 (which had already dropped below the voltage at node 131) is pulled more strongly to ground than the voltage at node 131. Thus, the voltage at node 131 is pulled to Vdd, while the voltage at node 132 is pulled to ground. (See FIG. 2 at time $t_3$.)

Sense amplifier 100, as well as the circuitry that generates enable signal SAEN, may be manufactured using silicon-on-insulator (SOI) technology. Transistors that are manufactured using SOI technology comprise layers of silicon and are deposited on an insulating substrate. Because these silicon layers are built on top of an insulator, the bodies of the transistors typically "float," so that the body voltages of the transistors may have different values at different times. For example, if a transistor is between two nodes that are both at ground, the body voltage of the transistor will be close to ground as well. If, the other hand, one of these nodes is at Vdd, the body voltage of the transistor will be higher than ground (e.g., 100 millivolts.) Thus, the body voltage of the transistor will vary with the state of the circuit in which it is used (i.e., the voltages at the nodes.)

Variations in the body voltages of the transistors are important because the threshold voltage of each transistor varies with the body voltage of the transistor. This, in turn, is important because the response of the transistor (e.g., the delay with which the transistor switches) varies with the threshold voltage of the transistor. The transistor response is therefore dependent, to some extent, upon the previous state of the circuit in which it is used. This dependence upon the previous state is sometimes referred to as the history effect.

The history effect is important in the context of sense amplifier 100 because it may cause variations in the timing of enable signal SAEN. In FIG. 2, SAEN goes high at time $t_2$. At time $t_2$, the voltage difference between nodes 131 and 132 is anticipated to be great enough that the lower voltage (in this particular example, the voltage at node 132) is pulled to ground, while the higher voltage (in this example, the voltage at node 131) is pulled to Vdd. If, however, the history effect causes variations in the timing of signal SAEN, this signal may go high either sooner or later than anticipated. If SAEN goes high too early, there may not have been sufficient time for the voltage difference between nodes 131 and 132 to develop. If the voltage difference is too small, the nodes may be pulled to the wrong voltages (i.e., the voltage at node 132 may be pulled high, while the voltage at node 131 may be pulled low.) In this case, the sense amplifier has malfunctioned and inverted the signals that were intended to be generated on the data lines.

The history effect may alternatively cause SAEN to be delayed. In this case, there will have been sufficient time for the voltage difference to develop between nodes 131 and 132, so sense amplifier 100 will operate properly, in terms of amplifying the signals without converting them. It is necessary, however, to allow sufficient time after SAEN goes high for the data lines to be pulled to ground and to Vdd. In other words, sense amplifier 100 operates properly, but it operates more slowly than if the timing is as anticipated. It therefore be necessary to operate sense amplifier 100 at a slower speed than desired.

SUMMARY OF THE INVENTION

One or more of the problems outlined above may be solved by the various embodiments of the invention. Broadly speaking, the invention comprises systems and methods for reducing or eliminating the effect of timing variations in signals generated by devices that are subject to the history effect.

In one embodiment, a circuit such as a sense amplifier is enabled using a combination of two signals, where one of the signals is subject to timing variations resulting from the history effect, and the other of the signals is not subject to such timing variations. In this embodiment, instead of using a single transistor to couple or decouple the sense amplifier from ground as determined by an enable signal applied to the transistor's gate (as in the prior art) two serially configured transistors are used. One of the transistors is switched on and off by a clock signal that is unaffected by history effects, and the other transistor is switched on and off by a signal that is affected by history effects. The history-effect signal is controlled by selectively delaying pulses of the signal. If a pulse is delayed by only a short delay, it overlaps with a pulse of the clock signal that switches on the other transistor. Both transistors are thereby switched on at the same time, and the sense amplifier is enabled. If a pulse is delayed by a long delay, it does not overlap with a pulse of the clock signal that switches on the other transistor, so the sense amplifier is not enabled.

An alternative embodiment comprises enabling circuitry configured to be coupled to operational circuitry to selectively enable the operational circuitry. The enabling circuitry can include, for example, a plurality of serially configured transistors between the operational circuitry and ground. When all of the serially configured transistors are switched on, the operational circuitry is enabled. Otherwise, the operational circuitry is disabled. In one embodiment, the enabling circuitry comprises two transistors, where one is switched on and off by a timing signal that is subject to history effects, and the other is not subject to history effects. For example, one of the transistors may be switched on and off by a simple clock signal, while the other is switched on and off by an enable or select signal that may have variable timing because of the history effect.

Another alternative embodiment may comprise a method that includes providing operational circuitry, coupling the operational circuitry to ground or a voltage source through enabling circuitry, and providing signals (some of which are subject to timing variations arising from the history effect, and some of which are not) to enable the operational circuitry at times that are not subject to variations because of the history effect. This method may be implemented in devices such as sense amplifiers, or even in other devices.

Numerous additional embodiments are also possible.

The various embodiments of the invention may provide a number of advantages over the prior art. For instance, even though history effects are still present in the timing signals, they do not affect the timing with which circuits such as the sense amplifiers described above are enabled. Because the history effect is essentially neutralized, it is not necessary to completely eliminate the history effect (e.g., by using non-SOI sense amplifiers.) The equipment in which the sense amplifiers are used can thereby take advantage of the higher speeds at which SOI devices can operate. Still other advantages may be provided.

BRIEF DESCRIPTION OF THE DRAWINGS

Other objects and advantages of the invention may become apparent upon reading the following detailed description and upon reference to the accompanying drawings.

Figure 1:
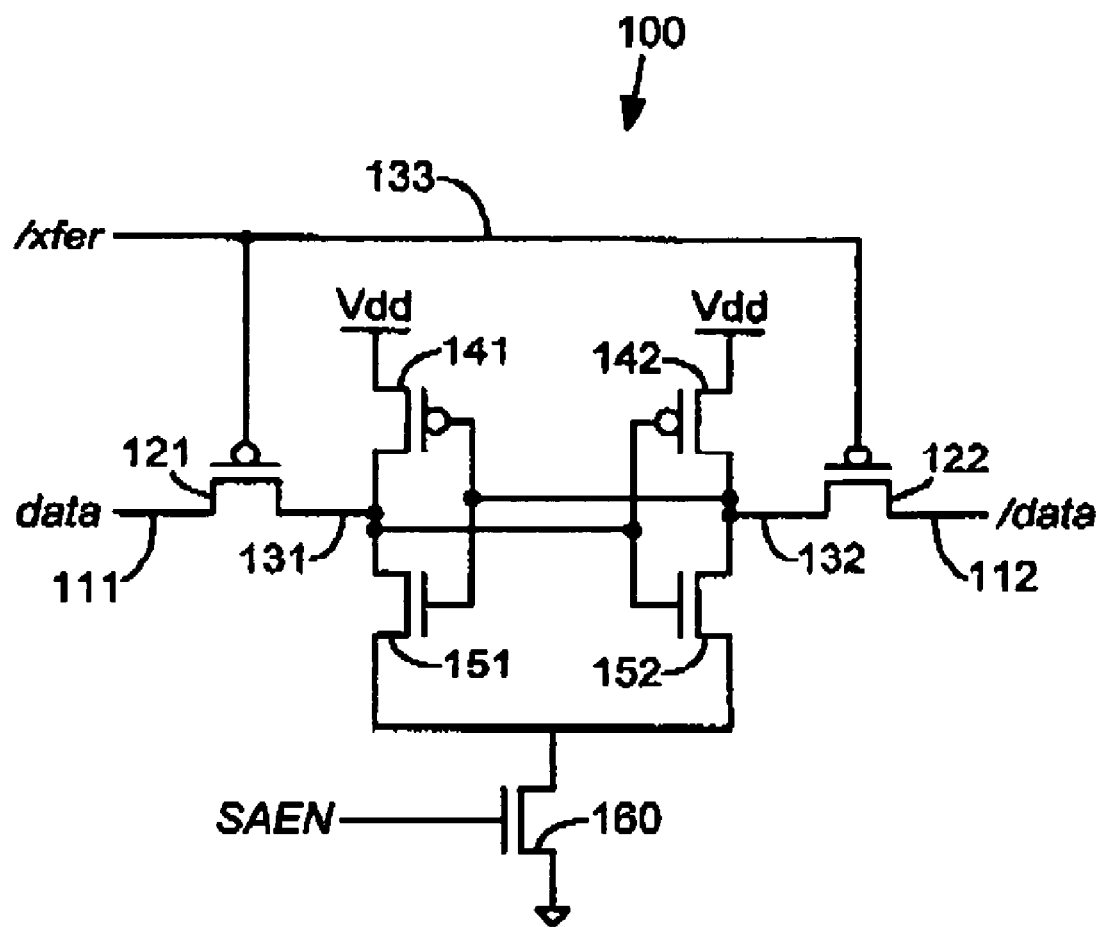
FIG. 1 is a diagram illustrating the design of an exemplary latch-type sense amplifier in accordance with the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for reducing or eliminating the effect of timing variations in signals generated by devices that are subject to the history effect. In one embodiment, a circuit such as a sense amplifier is enabled using a combination of two signals, where one of the signals is subject to timing variations resulting from the history effect, and the other of the signals is not subject to such timing variations. The sense amplifier is enabled when the signals are both high.

In one embodiment, a device such as a processor for a gaming system incorporates a plurality of sense amplifiers. The sense amplifiers and related circuitry are manufactured, at least in part, using silicon-on-insulator (SOI) technology. One or more of the sense amplifiers are enabled using two sets of timing signals. A first set of timing signals includes signals that are generated by SOI-based devices and therefore suffer from variations arising from the history effect. A second set of timing signals is not subject to variations arising from the history effect. By enabling the sense amplifiers using a combination of these signals, variations arising from the history effect are reduced or eliminated in the timing with which the sense amplifiers are enabled.

In this embodiment, each of the sense amplifiers is designed to be essentially identical to a prior art sense amplifier, except that, where the prior art sense amplifier is enabled by a single signal that is subject to timing variations from the history effect, the sense amplifier in the present embodiment is enabled by a pair of signals, one of which is subject to timing variations from the history effect, and one of which is not. Each of these signals is coupled to one of two transistors that are serially coupled between the sense amplifier pull-down transistors and ground. As a result, the sense amplifier is enabled only when both of these serially-disposed transistors are switched on (as compared to a single transistor being switched on in the prior art sense amplifier.)

In one particular embodiment, a first signal (the signal that is not subject to variations from the history effect) is a clock signal that goes high and low with a known periodicity and timing. A second signal (the signal that is subject to history effect variations) is very similar to the enable signal that is provided to the prior art sense amplifier, except that it is processed by a circuit that can selectively delay the signal, based upon a separate input to the circuit (a select signal.) If the second signal is not delayed, it overlaps with the first signal, and both transistors are turned on at the same time, enabling the sense amplifier. If the second signal is delayed, it is pushed back so that it does not overlap with the first signal. As a result, the transistors are not turned on at the same time, and the sense amplifier is not enabled.

Figure 3:
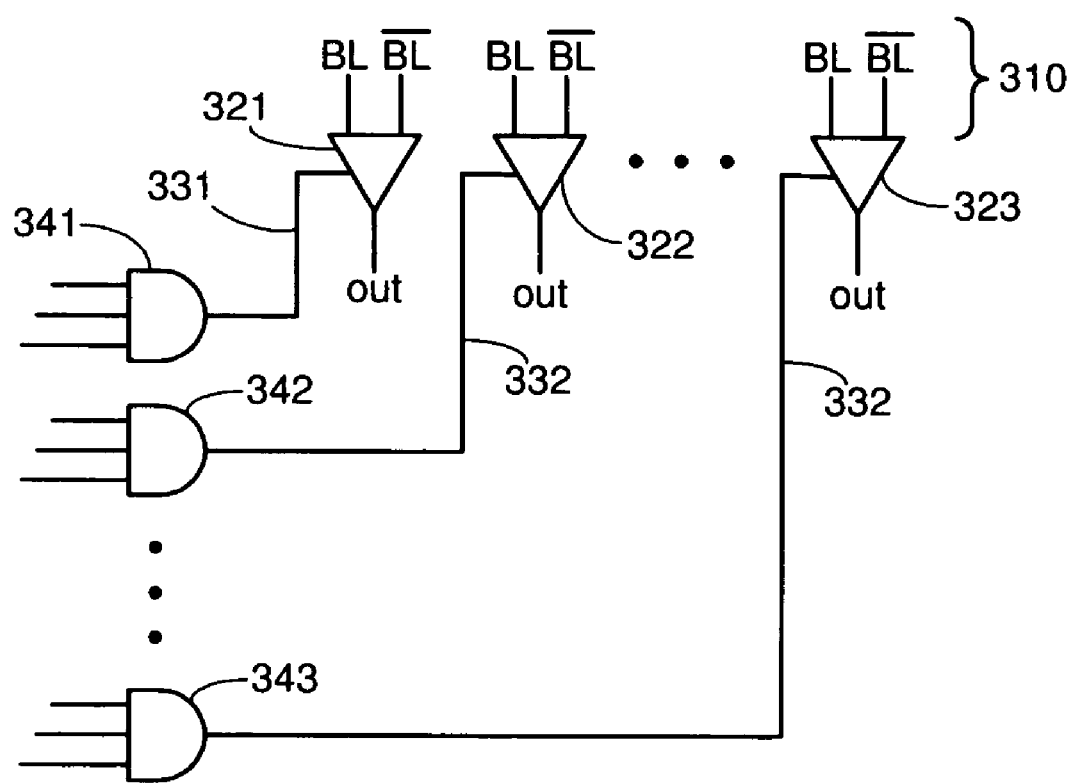
FIG. 3 is a diagram illustrating exemplary circuitry that employs a plurality of sense amplifiers which can be selectively enabled.

Referring to FIG. 3, a diagram illustrating exemplary circuitry that employs sense amplifiers similar to those described above is shown. As depicted in this figure, a device includes circuitry 300 that is intended to selectively amplify the differences between voltages on multiple pairs of input bit lines 310. Circuitry 300 includes a series of sense amplifiers 321–323, each of which receives input signals from a corresponding pair of the bit lines 310. Each of sense amplifiers 321–323 is enabled by a signal received via a corresponding control line, 331–333. The enable signal on each of control lines 331–333 is generated by a corresponding one of decoders 341–343. It should be noted that, although only three sets of sense amplifier, control lines and decoders are depicted in the figure, there can be any number of sets.

Each of decoders 341–343 receives multiple signals via corresponding signal lines that are input to the respective decoders. In this embodiment, each of the decoders comprises a simple AND gate. If all of the signals input to the AND gate are asserted, the output of the AND gate is asserted. If one or more of the signals input to the AND gate is not asserted, the output of the AND gate is not asserted. Because decoders 341–343 and the logic gates that are used to generate the inputs to these decoders are manufactured using SOI technology, the enable signals that are generated at the outputs of the decoders are subject to timing variations arising from the history effect. That is, the enable signals that are provided to the various sense amplifiers (321–323) may have rising/falling edges that occur either sooner or later than an ideal signal. As noted above, if the enable signals are asserted sooner than the ideal time, the voltage difference between the data lines may not be large enough, and the sense amplifier may malfunction. If, on the other hand, the enable signals are asserted later than the ideal time, the sense amplifier may operate more slowly than is desired.

Figure 2:
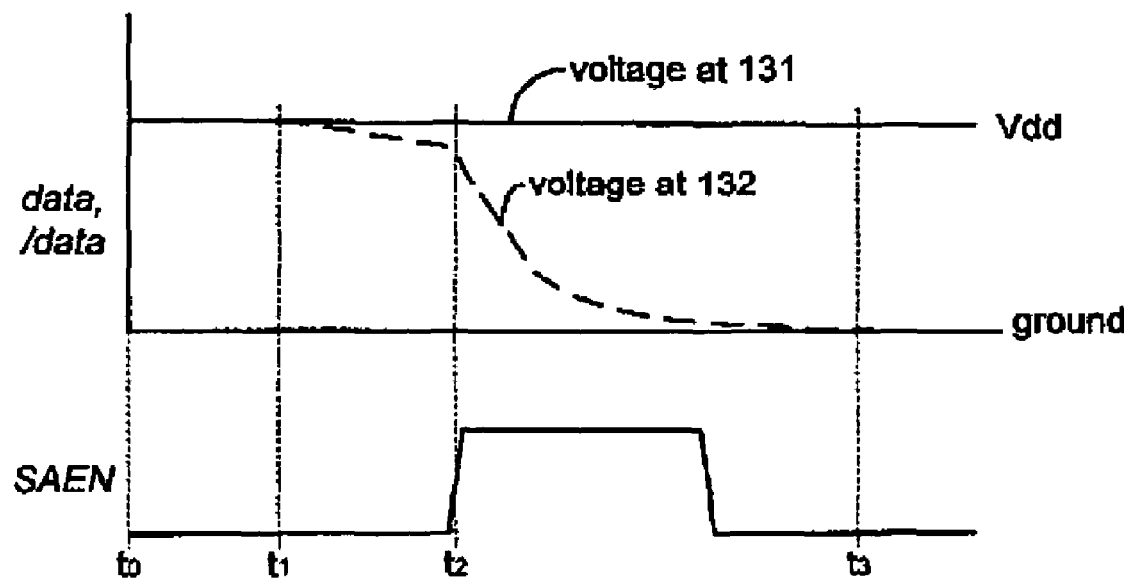
FIG. 2 is a diagram illustrating the voltage levels at intermediate nodes in the sense amplifier of FIG. 1.
Figure 4A:
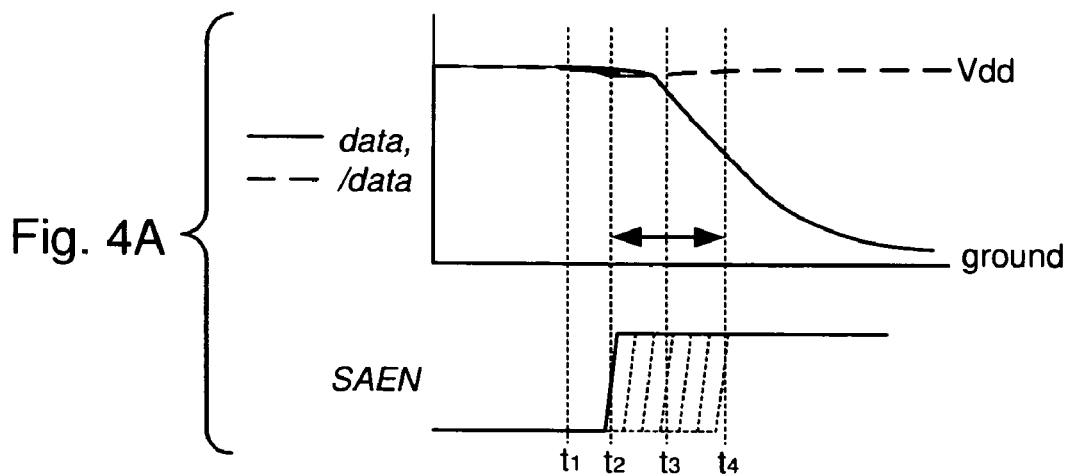
FIGS. 4A–4C are diagrams illustrating the voltages on the data lines of sense amplifiers in accordance with one embodiment.
Figure 4B:
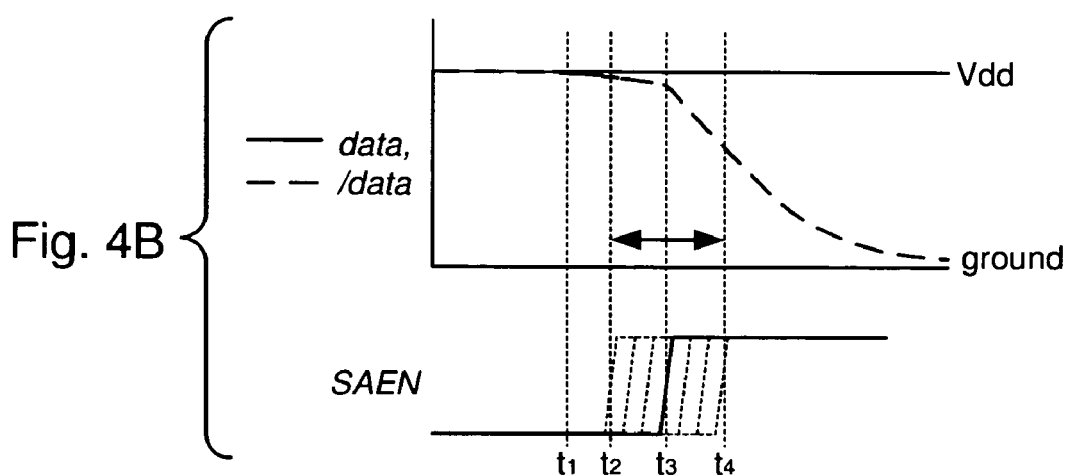
Figure 4C:
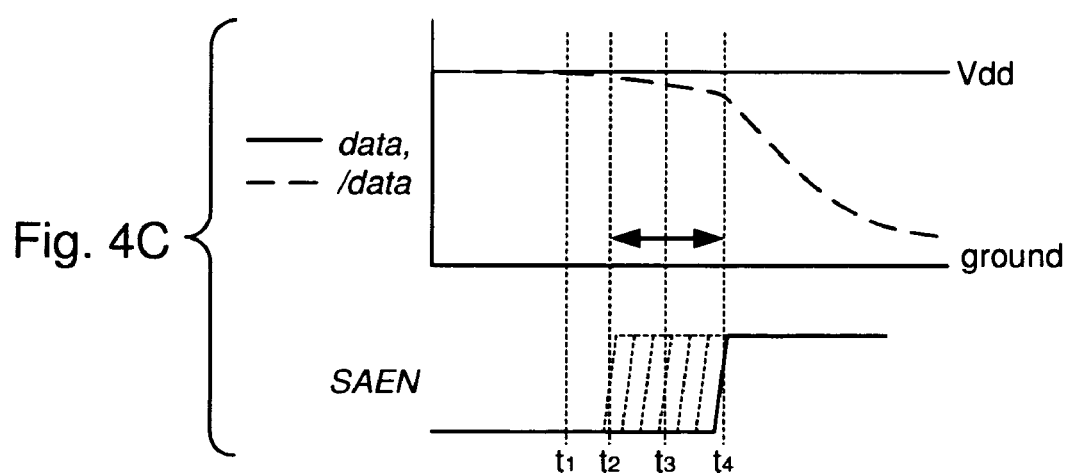

The effects of variations in the timing of the enable signals are illustrated in FIGS. 4A–4C. FIGS. 4A–4C are diagrams illustrating the voltages on the data lines of the sense amplifiers, similar to the diagram of FIG. 2. Each of these figures shows the voltages on the data lines and the timing of the corresponding enable signal. FIG. 4A shows the situation in which the enable signal, SAEN, is asserted earlier than desired, FIG. 4B shows the situation in which the enable signal is asserted at the desired time, and FIG. 4C shows the situation in which the enable signal is asserted later than desired.

Referring to FIG. 4B, the intended timing is illustrated. Initially, both data and /data are precharged to Vdd. It can be seen that, at time $t_1$, the /data voltage begins to drop below the data voltage, which remains at Vdd. At time $t_3$, enable signal SAEN is asserted. SAEN is illustrated by the solid line. The dotted lines on the lower portion of the figure illustrate the possible variations in the timing with which SAEN is asserted. At $t_3$, the difference between the data and /data voltages is sufficient to ensure that the lower of the two (/data) is pulled to ground, while the higher of the two (data) is pulled to Vdd.

Referring to FIG. 4A, enable signal SAEN is asserted earlier than desired. Again, the data and /data voltages are initially precharged to Vdd. At time $t_1$, /data begins to drop below data. In this scenario, however, SAEN is asserted at time $t_2$, rather than at time $t_3$. Although the voltage of /data is actually slightly lower than the voltage of data, the voltage difference is not sufficiently large to prevent factors such as variations in the threshold voltages of transistors in the sense amplifier from causing the wrong data line to be pulled to ground. In other words, even though /data has a lower voltage than data, data is pulled to ground, while /data is pulled to Vdd. The sense amplifier has therefore malfunctioned.

Referring to FIG. 4C, the opposite situation occurs. That is, enable signal SAEN is asserted later than intended. Similar to the situations illustrated in FIGS. 4A and 4B, the data and /data voltages are initially precharged to Vdd, and at time $t_1$, /data begins to drop below data. At time $t_3$, the voltage difference between data and /data is sufficiently large to ensure the proper operation of the sense amplifier, but SAEN has not yet been asserted. SAEN is eventually asserted at time $t_4$. The late assertion of SAEN does not cause the sense amplifier to malfunction, but as can be seen in the figure, since the sense amplifier is enabled later than desired, it also takes longer for the sense amplifier to pull /data to ground. It is therefore necessary to wait a bit longer for /data to be pulled low. Because it takes longer to pull /data to ground, the sense amplifier must be operated at a slower speed. This defeats one of the purposes of using the SOI devices in the first place (i.e., to achieve greater speed.)

It is apparent from the FIGS. 4A–4C that the timing with which the sense amplifiers are enabled is very important. While it may not be possible to eliminate the history effect in SOI-based devices, the embodiments of the present invention are intended to reduce or eliminate the impact of these variations. This is accomplished by using the same type of enable signals that are used in prior art devices, but using these signals in combination with other signals that are not subject to the history effect.

Figure 5:
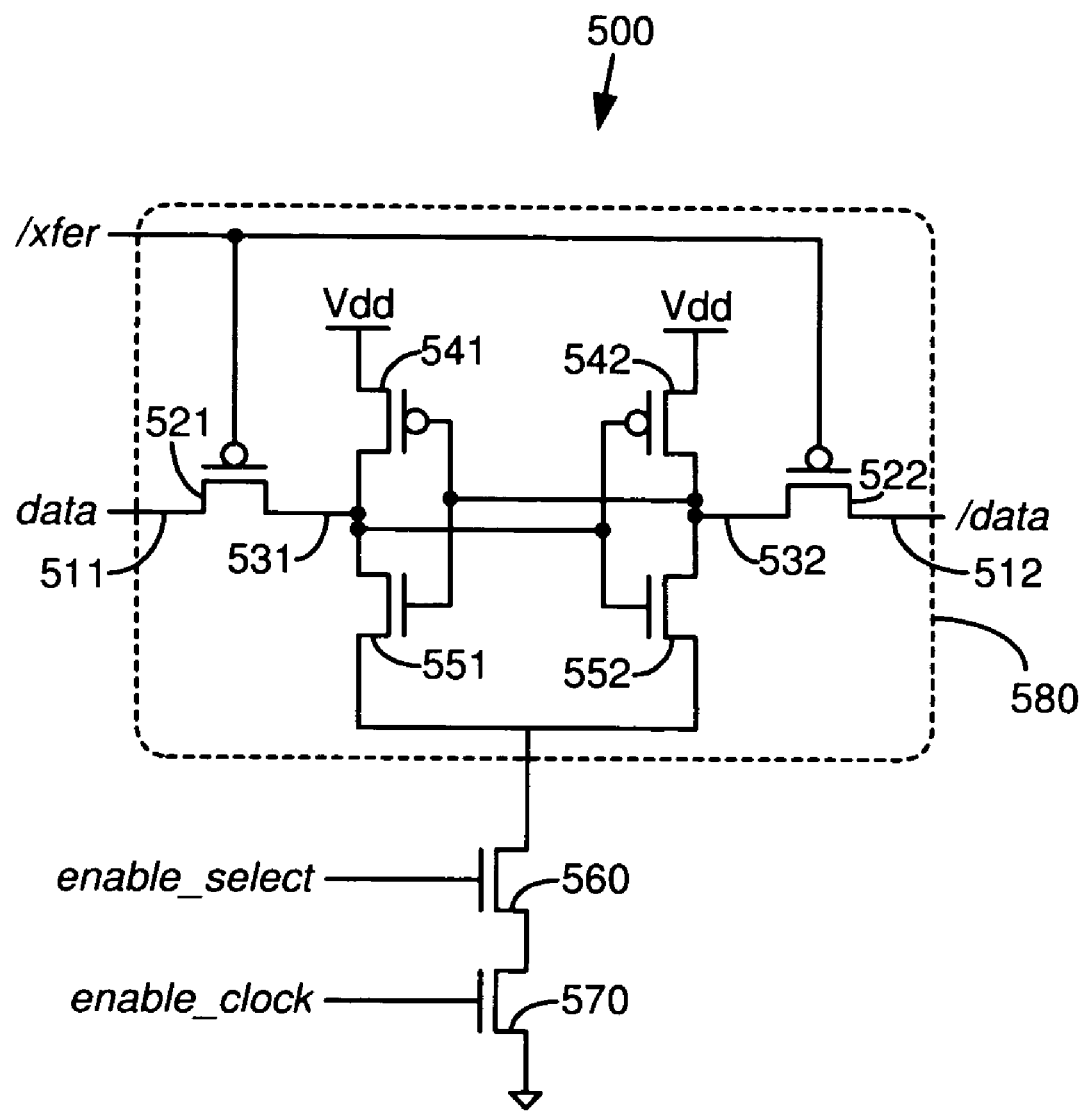
FIG. 5 is a diagram illustrating the structure of a sense amplifier in accordance with one embodiment.

This can be illustrated with respect to an exemplary embodiment of the invention, such as is illustrated in FIG. 5. FIG. 5 is a diagram illustrating the structure of a sense amplifier in accordance with one embodiment of the invention. Sense amplifier 500 includes eight transistors that are interconnected to enable the sensing of voltage differences between two data lines and amplification of these voltage differences. The amplified voltage difference is produced on the same two data lines.

Sense amplifier 500 includes four NMOS transistors and four PMOS transistors. Each of the data lines is coupled to a different one of the PMOS transistors. Data line 511, which has a corresponding voltage, data, is coupled to transistor 521. Transistor 521 is also coupled to an intermediate node, 531, so that current can flow between data line 511 and intermediate node 531 when transistor 521 is switched on. Transistor 521 is controlled by a transfer signal, /xfer, which is applied to the gate of transistor 521 via line 533. Similarly, data line 512, which has a corresponding voltage /data, is coupled to an intermediate node, 532, through PMOS transistor 522. The gate of transistor 522 is also coupled to line 533, so that transistor 522 is switched on and off by transfer signal /xfer.

Intermediate node 531 is coupled to a power supply voltage, Vdd, through PMOS transistor 541. Node 531 is coupled to ground through three NMOS transistors, 551, 560 and 570. The gates of PMOS transistor 541 and NMOS transistor 551 are tied together so that, as one of these transistors is switched on, the other is switched off, and vice versa. The gates of transistors 541 and 551 are coupled to intermediate node 532 (the intermediate node on the opposite side of sense amplifier 500.)

Intermediate node 532 is coupled to the power supply voltage and to ground in a desired manner that is symmetric to intermediate node 531. Node 532 is coupled to the power supply voltage through PMOS transistor 542, and is coupled to ground through three NMOS transistors, 552, 560 and 570. The gates of transistors 542 and 552 are tied together so that, as one is switched on, the other is switched off, and vice versa. The gates of transistors 542 and 552 are coupled to node 531, which is on the opposite side of the sense amplifier.

Transistors 560 and 570 are coupled in series between an operational portion (580) of sense amplifier 500 and ground. It should be noted that the use of the term "operational portion" to describe the portion of sense amplifier 500 excluding transistors 560 and 570 is not intended to imply that these transistors are not in some manner operational, or that the "operational portion" of sense amplifier would function properly in the absence of these transistors. The term "operational portion" is simply used to identify the portion of sense amplifier 500 excluding transistors 560 and 570. Transistors 560 and 570 form part of what can be considered an enabling portion of sense amplifier 500. That is, the portion of the sense amplifier that controls when the sense amplifier is enabled.

Conventionally, a single transistor is coupled between the operational portion of the sense amplifier and ground, and is switched on and off to enable and disable the sense amplifier, respectively. See, for example, transistor 160 of sense amplifier 100. Sense amplifier 100 is enabled by switching on transistor 160, and thereby allowing current to flow from nodes 131 and 132, through transistors 151 and 152, respectively, and finally through transistor 160 to ground. By contrast, sense amplifier 500 is enabled by switching on both transistor 560 and transistor 570. If either of these transistors is switched off, intermediate nodes 531 and 532 are effectively isolated from ground, and the sense amplifier is disabled.

As described above, transistor 160 is conventionally controlled by an enable signal that is subject to timing variations arising from the history effect. The use of two transistors, 560 and 570, in sense amplifier 500 can reduce or eliminate the effects of timing variations by using two signals in combination, where one of the signals is subject to timing variations arising from the history effect and the other of the signals is not subject to such variations.

Because sense amplifier 500 is enabled when the asserted signals applied to the gates of transistors 560 and 570 overlap, the sense amplifier can be controlled (i.e., enabled) by controlling the overlap of the signals. In one embodiment, the signal that is applied to the gate of transistor 560 is subject to timing variations arising from the history effect. The history effect causes variations in the timing of the signal because it does not have a simple, repeating cyclical pattern. The signal that is applied to the gate of transistor 570 (enable_clock) is a simple, repeating signal (essentially a clock signal,) and is therefore not subject to the same type of timing variations.

In one embodiment, the enable_select signal which is applied to the gate of the transistor 560 is generated by a circuit that receives a clock signal and a /select signal and selectively delays the clock signal, so that it either does or does not overlap with the repeating enable_clock signal applied to transistor 570. The design of an exemplary circuit is shown in FIG. 6.

Figure 6:
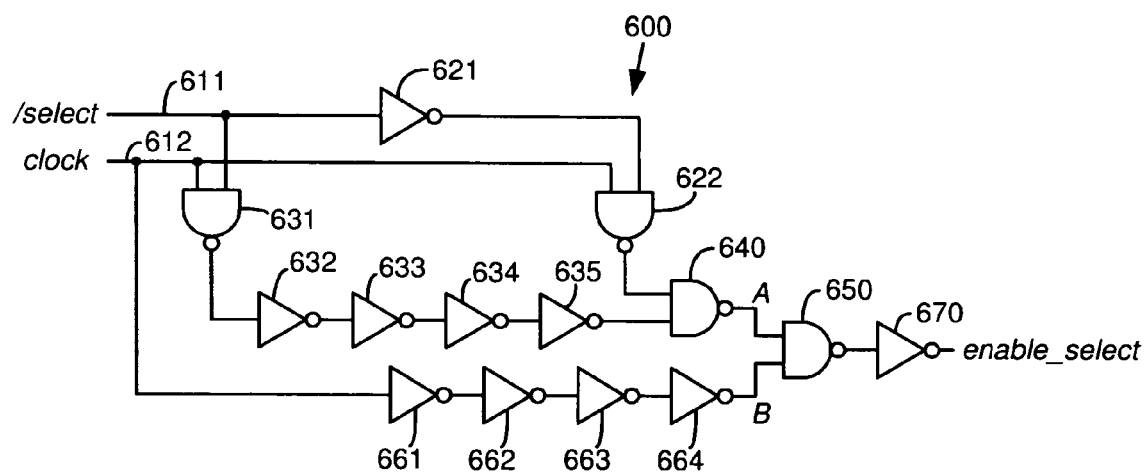
FIG. 6 is a diagram illustrating the structure of a timing circuit in accordance with one embodiment.

Referring to FIG. 6, a diagram illustrating the structure of a timing circuit in accordance with one embodiment is shown. Circuit 600 receives the two signals, /select and clock, and generates a third signal, enable_select, based upon these signals. Circuit 600 processes the /select signal through one of two paths. One of the paths can be traversed in a first amount of time, while the other path requires a different amount of time to be traversed. Thus, there is a "short" path and a "long" path. The output of circuit 600, enable_select, consists of pulses that occur with the same average frequency and have the same shape as pulses of the clock signal, but each of these pulses is delayed by either the "short" amount of time or the "long" amount time with respect to the corresponding pulses of the clock signal. As a result, the pulses of the enable_select signal should overlap (or not overlap, respectively) with the regular pulses of the enable_clock signal.

As depicted in FIG. 6, circuit 600 has a first line, 611, on which signal /select is received. Circuit 600 also has a second line, 612, on which the clock signal is received. The /select signal and the clock signal are input to both the "short" path and the "long" path. The "short" path consists of a single NAND gate, 622. Although inverter 621 could also be considered part of the "short" path, the purpose of inverter 621 is simply to allow one or the other of the paths to be selected, as will be explained in more detail below. The clock signal and the inverted /select signal are provided as inputs to NAND gate 622.

The "long" path consists of NAND gate 631 and inverters 632–635. NAND gate 631 receives both the /select signal and the clock signal as inputs. The output of NAND gate 631 is provided as an input to the serially arranged inverters, 632–635. The output of NAND gate 631 is therefore inverted four times. The use of multiple inverters 632–635 serves to delay the output of NAND gate 631 without inverting the signal (each pair of inverters cancels each other out.)

The outputs of the "short" and "long" paths (the outputs of NAND gate 622 and inverter 635, respectively) are provided as inputs to another NAND gate, 640. The output of NAND gate 640 is provided as an input to another NAND gate, 650. A second input to NAND gate 650 is provided by passing the clock signal through four serially arranged inverters. This serves to delay the clock signal. Because the clock signal is passed through an even number of inverters, the signal which is input to NAND gate 650 is not inverted with respect to the originally received clock signal. The output of NAND gate 650 is then inverted by inverter 670, and the result, the enable_select signal, is provided to transistor 560 (see FIG. 5.)

The /select signal is either deasserted (when the signal is low) or asserted (when the signal is high) in order to select either the "short" path or the "long" path within circuit 600. The paths are alternately selected by providing /select and its inverse to the initial NAND gates (622 and 631). Whichever of these NAND gates receives a signal that is high is selected. Thus, when /select is high, the "long" path is selected and the "short" path is deselected. When /select is low, the "short" path is selected and the "long" path is deselected.

If /select is low (the short path is selected,) the input to NAND gate 622 which is the inverse of this signal is high. As a result, NAND gate 622 serves to invert the signal (clock) that is received on its other input. The output of NAND gate 622 is therefore the inverse of the clock signal, slightly delayed. When /select is low, the corresponding input to NAND gate 631 is low, and the output of this gate is high, regardless of the signal on the other input line (clock.) The signal output by NAND gate 631 is inverted four times before arriving at the end of the long path. Thus, one of the inputs to NAND gate 640 is high, and the other is the inverse of the clock signal. NAND gate 640 therefore serves to invert the inverse clock signal, and to delay it a bit more. NAND gate 640 may also introduce some uncertainty in the timing of the rising edge of this signal. NAND gate 640 therefore produces at its output a signal that is very similar to the clock signal, except that this signal is delayed by a short amount of time from the original clock signal. This signal is input to NAND gate 650. The other input to NAND gate 650 is also a delayed facsimile of the clock signal. This input is produced by passing the clock signal through inverters 661–664, which have the cumulative effect of delaying the clock signal, but not inverting it. Because both inputs to NAND gate 650 go high (and low) at approximately the same time, the output of NAND gate 650 is essentially the inverse of these signals. The output of NAND gate 650 is then inverted by inverter 670 to produce the enable_select signal, which is a slightly delayed facsimile of the clock signal.

If /select is high (the long path is selected,) the input to NAND gate 622 which is received from inverter 621 is low. Consequently, the output of NAND gate 622 will be high, regardless of the signal received on the other input to the gate (clock.) Because the /select signal at one of the inputs to NAND gate 631 is high, NAND gate 631 serves to invert the signal received at its other input (i.e., clock.) The signal output by NAND gate 631 is inverted four more times as the signal traverses the long path. The inputs to NAND gate 640 therefore consists of the high output of NAND gate 622 and the delayed, inverted clock signal output by inverter 635. Because the input from NAND gate 622 is high, NAND gates 640 serves to invert the delayed, inverted clock signal. NAND gate 640 may again introduce some uncertainty in the timing of the rising edge of the signal.

From this point, the processing of the signals is essentially the same as when /select is low. The signal is input to NAND gate 650, along with a second delayed facsimile of the clock signal received via inverters 661–664. The output of NAND gate 650 is a delayed, inverted facsimile of the clock signal, which is then inverted again by inverter 670. The difference between these two situations is that, when /select is low, the facsimile of the clock signal produced at the output of NAND gate 640 is delayed by a short amount of time, and when /select is high, the facsimile of the clock signal at the output of NAND gate 640 is delayed by a longer amount of time.

Figure 7:
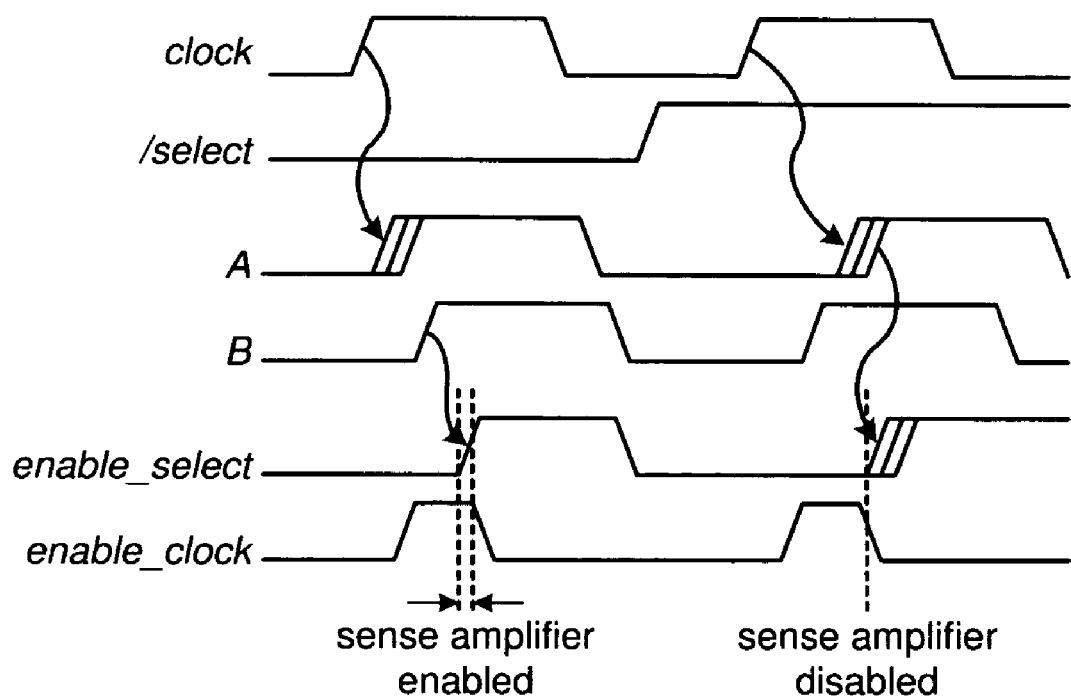
FIG. 7 is a timing diagram illustrating signals input to, output from, and at various points within the timing circuit shown in FIG. 6.

The various signals described above are illustrated in FIG. 7. FIG. 7 is a timing diagram illustrating the signals input to and output from circuit 600, as well as various signals within this circuit. At the top of FIG. 7 is the clock signal which is input to circuit 600. The clock signal is a simple periodic signal that has rising and falling edges at regular intervals. The next signal is the /select signal that is input to circuit 600. The /select signal is not periodic. The /select signal is asserted when the sense amplifier corresponding to circuit 600 is selected. The /select signal is therefore similar too the signals that are input to system 300 (see FIG. 3) to select one of sense amplifiers 321–323.

The next signal shown in FIG. 7 is the signal produced at the output of NAND gate 640. This intermediate signal is simply designated as "A." It should be noted that the multiple lines on the rising edges of the pulses of signal A denote timing variations. There is actually a single rising edge, but the position of this edge may fall at different places within the range indicated by the multiple lines in the figure. It should also be noted that, except as otherwise noted, there may be timing variations at other points in the signals. These variations are not depicted in the figure because they are not important to the explanation that follows.

It can be seen from the figure that signal A has pulses that correspond to the pulses of the clock signal, but which are delayed with respect to the corresponding pulses of the clock signal. It can also be seen that the magnitude of the delay depends upon whether or not the /select signal is asserted. If the /select signal is not asserted (i.e., it is low,) the pulse of signal A will have a short delay from the corresponding pulse of the clock signal. If the /select signal is asserted (i.e., it is high,) the pulse of signal A will have a longer delay from the corresponding pulse of the clock signal. It can also be seen that some timing variation caused by the history effect is introduced into the rising edges of the pulses of signal A.

The next signal shown in FIG. 7 is the signal produced at the output of inverter 664. This intermediate signal is designated as "B." Because signal B is produced by simply passing the clock signal through four serially configured inverters, signal B is essentially identical to the clock signal, except for the delay that is introduced by the inverters, and signal B is not influenced by the history effect.

The next signal shown in FIG. 7 is the enable_select signal which is produced at the output of circuit 600. As described above, the enable_select signal is produced by AND'ing the outputs of NAND gate 640 and inverter 664 (i.e., signals A and B.) More specifically, signals A and B are input to NAND gate 650, and then the result is inverted by inverter 670. It can be seen that the enable_select signal is high where signals A and B overlap, and low elsewhere. Because the pulses of signal A are delayed by varying amounts from the corresponding pulses of the clock signal, the overlapped portions of signals A and B are also delayed by varying amounts with respect to the pulses of the clock signal. It can also be seen that the enable_select signal is slightly delayed with respect to the overlapped portions of signals A and B because of the delays in the gates.

The final signal shown in FIG. 7 is the enable_clock signal. The enable_clock signal has a fixed pattern that is continually repeated. In this embodiment, the enable_clock signal goes high for a predetermined interval, then goes low for an interval, and repeats. The duty cycle of the signal need not be 50 percent. The enable_clock signal is not found in circuit 600. The enable_clock signal is shown in FIG. 7 because it is this signal, in conjunction with the enable_select signal, that enables sense amplifier 500. As noted above, sense amplifier 500 is enabled only when both transistor 560 and transistor 570 are switched on. This corresponds to overlap between the enable_select signal, which such as transistor 560 on and off, and the enable_clock signal, which switches transistor 570 on and off.

As shown in FIG. 7, the enable_select and enable_clock signals overlap when the /select signal for the sense amplifier is low and the delay between pulses of signal A and pulses of the clock signal is short. This is shown on the left side of FIG. 7. During the interval in which these signals overlap, the sense amplifier is enabled. When the /select signal for the sense amplifier is high, the delay between pulses of signal A and pulses of the clock signal is longer. As a result, the pulses of the enable_select signal are delayed sufficiently that they do not overlap with the pulses of the enable_clock signal. As a result, the sense amplifier is not enabled.

Upon closer examination of the enable_select and enable_clock signals illustrated in FIG. 7, it can be seen that the overlap between these signals begins with the rising edge of the enable_select signal and ends with the falling edge of the enable_clock signal. Thus, the sense amplifier is enabled when the rising edge of the enable_select signal occurs before the falling edge of the enable_clock signal. At first, it might appear that this might not be able to eliminate the problems arising from the history effect because the enable_select signal is dependent, in part, upon signal A, which has history effect variations. It should be noted, however, that the enable select signal is produced by the overlap of signals A and B. By ensuring that any timing fluctuations in the pulses of signal A occur prior to the rising edge of signal B when the sense amplifier is selected (and the path delay is short,) it is also ensured that the occurrence of the rising edge of the enable_select signal will be based on the rising edge of signal B, which does not suffer from the history effect.

By the same token, it is necessary in this embodiment to ensure that, when the sense amplifier is not selected (i.e., /select is high,) the delay between the clock signal pulse and the corresponding pulse of signal A and is sufficiently large that the rising edge of signal A will occur after the falling edge of the enable_clock signal. This is shown on the right side of FIG. 7.

The sense amplifier and timing circuit described above are presented to provide an exemplary implementation of one embodiment of the invention. It is contemplated that many alternative embodiments will be apparent to persons of skill in the art of the invention upon reading the present disclosure. For example, sense amplifiers of varying designs (many of which are known in the art) could replace the single transistor that is typically positioned between the data lines and ground to enable/disable the sense amplifier with two or more serially configured transistors as described above which are controlled by two or more corresponding signals that must overlap in order to enable the sense amplifier. Further, alternative embodiments could use a combination of signals, some of which are subject to the history effect and some of which are not, to produce a single signal that could then be to switch on/off a single enabling transistor positioned between the data lines and ground. Still further, instead of the power supply and ground voltages referenced in the description above, some designs for sense amplifiers could employ different voltages that could necessitate placement of the enabling transistors between the data lines and a non-ground voltage or the power supply voltage. Still further, many alternative designs could be used for a timing circuit to generate the signals to switch the enabling transistors on and off.

In addition to other sense amplifier designs, it is possible for some embodiments of the invention to be implemented in applications other than sense amplifiers. For example, any circuit that is enabled by switching on (or off) a transistor could implemented the serially configured transistors and timing circuit described above. Obviously, variations in the design of the timing circuit are possible in these embodiments, just as they are possible in embodiments involving sense amplifiers. The invention should therefore be construed to include embodiments in which an operational portion of a device is enabled by coupling it to a voltage sink or source through an enabling portion of the device, and in which the enabling portion of the device is configured to couple/decouple the operational portion of the device to the voltage sink/source based on a plurality of signals that include at least one signal that is subject to timing variations arising from the history effect and at least one signal that is not subject to history-effect-based timing variations.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The invention claimed is:

1. A silicon-on-insulator (SOI) sense amplifier comprising:
   an operational portion of the sense amplifier; and
   an enabling portion of the sense amplifier coupled to the operational portion;
   wherein the enabling portion receives a first timing signal that is affected by history effects and a second timing signal that is unaffected by the history effects and wherein the enabling portion is configured to enable or disable the operational portion based upon overlap of the first timing signal and the second timing signal.

2. The sense amplifier of claim 1, wherein the sense amplifier comprises a latch-type sense amplifier.

3. The sense amplifier of claim 1, wherein the enabling portion of the sense amplifier comprises a plurality of serially configured transistors coupled between the operational portion and ground.

4. The sense amplifier of claim 3, wherein at least one of the serially configured transistors is coupled to receive, and configured to be switched on and off by, the second timing signal that is unaffected by history effects.

5. The sense amplifier of claim 4, wherein the second timing signal that is unaffected by the history effects comprises a signal having a fixed pattern that is continually repeated.

6. The sense amplifier of claim 3, wherein at least one of the serially configured transistors is coupled to receive, and configured to be switched on and off by, the first timing signal that is affected by the history effects.

7. The sense amplifier of claim 6, wherein the first timing signal that is affected by the history effects and is received by the serially configured transistor comprises a signal corresponding to selection of the sense amplifier from a plurality of sense amplifiers.

8. A silicon-on-insulator (SOI) sense amplifier comprising:
   an operational portion of the sense amplifier; and
   an enabling portion of the sense amplifier coupled to the operational portion of the sense amplifier, wherein the enabling portion of the sense amplifier includes a plurality of serially configured transistors coupled between the operational portion and ground;
   wherein the enabling portion is coupled to the operational portion and configured to enable or disable the operational portion based upon overlap of a first timing signal that is affected by history effects and a second timing signal that is unaffected by the history effects;
   wherein the enabling portion of the sense amplifier further comprises a timing generation circuit which is configured to generate the first timing signal that is affected by the history effects by selectively routing pulses of a clock signal through either circuitry defining a short-delay path or circuitry defining a long-delay path, depending upon whether a select signal is asserted.

9. The sense amplifier of claim 8, wherein the timing generation circuit is configured so that the pulses routed through the short-path circuitry overlap with pulses of a clock signal that is unaffected by the history effects, and so that the pulses routed through the long-path circuitry do not overlap with the pulses of the clock signal that is unaffected by the history effects.

10. The sense amplifier of claim 1, wherein the enabling portion of the sense amplifier further comprises a timing generation circuit which is configured to generate the first timing signal that is affected by the history effects.

11. A silicon-on-insulator (SOI) sense amplifier comprising:
    an operational portion of the sense amplifier; and
    an enabling portion of the sense amplifier coupled to the operational portion;
    wherein the enabling portion is configured to enable or disable the operational portion based upon overlap of a first timing signal that is affected by history effects and a second timing signal that is unaffected by the history effects;
    wherein the enabling portion of the sense amplifier includes a timing generation circuit which is configured to generate the first timing signal that is affected by the history effects, wherein the timing generation circuit is configured to selectively delay pulses of a clock signal by either a short delay, or a long delay.

12. The sense amplifier of claim 11, wherein the timing generation circuit comprises circuitry defining a short-delay path and circuitry defining a long-delay path, wherein the timing generation circuit is configured to receive a select signal and a clock signal wherein the timing generation circuit is configured to route the pulses of the clock signal through the short-path circuitry if the select signal is asserted and through the long-path circuitry if the select signal is not asserted.

13. The sense amplifier of claim 12, wherein the timing generation circuit is configured so that the pulses routed through the short-path circuitry overlap with pulses of a clock signal that is unaffected by the history effects, and so that the pulses routed through the long-path circuitry do not overlap with the pulses of the clock signal that is unaffected by the history effects.

14. An enabling circuit configured to be coupled to an operational circuit to selectively enable the operational circuit, wherein the enabling circuit comprises:
  a plurality of serially configured transistors coupled between the operational circuit and ground;
  wherein at least one of the serially configured transistors is coupled to receive, and configured to be switched on and off by, a first timing signal that is unaffected by history effects;
  wherein at least one of the serially configured transistors is coupled to receive, and configured to be switched on and off by, a second timing signal that is affected by history effects; and
  wherein the operational circuit is enabled or disabled by overlap of the first timing signal and the second timing signal.

15. An enabling circuit configured to be coupled to an operational circuit to selectively enable the operational circuit, wherein the enabling circuit comprises:
  a plurality of serially configured transistors coupled between the operational circuit and ground,
    wherein at least one of the serially configured transistors is coupled to receive, and configured to be switched on and off by, a first timing signal that is unaffected by history effects, and
    wherein at least one of the serially configured transistors is coupled to receive, and configured to be switched on and off by, a second timing signal that is affected by the history effects, and
    wherein the operational circuit is enabled or disabled by overlap of the first timing signal and the second timing signal;
  a timing generation circuit which is configured to generate the second timing signal by selectively routing pulses of a clock signal through either circuitry defining a short-delay path or circuitry defining a long-delay path, depending upon whether a select signal is asserted.

16. The enabling circuit of claim 15, wherein the timing generation circuit is configured so that the pulses routed through the short-path circuitry overlap with pulses of the first timing signal, and so that the pulses routed through the long-path circuitry do not overlap with the pulses of the first timing signal.

17. A method for enabling a sense amplifier comprising:
  providing a sense amplifier, wherein the sense amplifier includes two or more serially configured transistors that selectively couple the sense amplifier to ground;
  providing a first timing signal that is affected by history effects to a corresponding one of the serially configured transistors;
  providing a second timing signal that is unaffected by the history effects to a corresponding one of the serially configured transistors; and
  controlling overlap of the first timing signal that is affected by the history effects with the second timing signal that is unaffected by the history effects to enable or disable the sense amplifier.

18. The method of claim 17, wherein the second timing signal that is unaffected by the history effects and is received by the serially configured transistor comprises a signal having a fixed pattern that is continually repeated.

19. The method of claim 18, wherein the second timing signal that is unaffected by the history effects and is received by the serially configured transistor comprises a clock signal.

20. The method of claim 17, wherein the first timing signal that is affected by the history effects and is received by the serially configured transistor comprises a signal corresponding to selection of the sense amplifier from a plurality of sense amplifiers.

21. A method for enabling a sense amplifier comprising:
  providing a sense amplifier, wherein the sense amplifier includes two or more serially configured transistors that selectively couple the sense amplifier to ground;
  providing a first timing signal that is affected by history effects to a corresponding one of the serially configured transistors;
  providing a second timing signal that is unaffected by the history effects to a corresponding one of the serially configured transistors, wherein the first timing signal that is affected by the history effects and is received by the serially configured transistor is a signal corresponding to selection of the sense amplifier from a plurality of sense amplifiers; and
  controlling overlap of the second timing signal that is unaffected by history effects with the first timing signal that is affected by the history effects to enable or disable the sense amplifier, wherein overlap of the first timing signal and the second timing signal is controlled by selectively delaying pulses of a clock signal by either a short delay or a long delay to produce the first timing signal that is affected by history effects.

22. The method of claim 21, wherein selectively delaying pulses of the clock signal comprises selectively routing pulses of the clock signal through either circuitry defining a short-delay path or circuitry defining a long-delay path, depending upon whether a select signal is asserted.

23. The method of claim 22, further comprising configuring the short and long delays so that pulses routed through the short-path circuitry overlap with pulses of a clock signal that is unaffected by The history effects, and so that pulses routed through the long-path circuitry do not overlap with pulses of the clock signal that is unaffected by the history effects.

* * * * *